US012631694B2

(12) United States Patent
Shea

(10) Patent No.: US 12,631,694 B2
(45) Date of Patent: May 19, 2026

(54) SENSING LEAKAGE CURRENT IN FAULT MANAGED POWER SYSTEMS

(71) Applicant: Schneider Electric USA, Inc., Boston, MA (US)

(72) Inventor: John J. Shea, Wake Forest, NC (US)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 176 days.

(21) Appl. No.: 18/618,547

(22) Filed: Mar. 27, 2024

(65) Prior Publication Data

US 2025/0306127 A1    Oct. 2, 2025

(51) Int. Cl.
*G01R 31/52* (2020.01)
*G01R 31/28* (2006.01)

(52) U.S. Cl.
CPC ......... *G01R 31/52* (2020.01); *G01R 31/2841* (2013.01)

(58) Field of Classification Search
CPC ........ G01R 31/52; H02H 1/0007; H02H 3/05; H02H 3/16; H02H 3/335; H02H 3/085; H02H 5/047
See application file for complete search history.

(56) References Cited

U.S. PATENT DOCUMENTS

| | | | | |
|---|---|---|---|---|
| 6,807,037 B1 * | 10/2004 | Patruno | ................. | G01R 31/52 361/45 |
| 2020/0233039 A1 * | 7/2020 | Jorgensen | ............... | H03F 3/181 |

| | | | | |
|---|---|---|---|---|
| 2021/0313796 A1 * | 10/2021 | Li | ........................ | H02H 1/0007 |
| 2023/0221380 A1 | 7/2023 | Shea et al. | | |
| 2023/0299661 A1 | 9/2023 | Lumanog | | |

FOREIGN PATENT DOCUMENTS

WO        2023244794 A1    12/2023

OTHER PUBLICATIONS

Extended European Search Report from EP Application No. 25159783. 1, dated Aug. 19, 2025, 6 pages.

* cited by examiner

*Primary Examiner* — Lee E Rodak
*Assistant Examiner* — Demetrius R Pretlow
(74) *Attorney, Agent, or Firm* — Stinson LLP

(57)        ABSTRACT

A fault managed power system (FMPS) measures leakage current in an electronic circuit. The FMPS comprises a source controller, leakage current sensor, pulsing controller, and load end circuit. The source controller generates a pulsing input defining a current-on time interval and current-off time interval. During the current-off time interval, a source driver of the source controller opens a source switch to disconnect power from a power source. The leakage current sensor utilizes a leakage current sensor driver to open a leakage current sensor switch. The pulsing controller utilizes a pulsing driver to close a pulsing switch to provide a return path for leakage current during the current-off time interval. A holdup capacitor at the load end circuit reverse biases a blocking diode to isolate a load from the electronic circuit, such that leakage current flows in the leakage current sensor to enable an accurate measurement of the leakage current.

21 Claims, 4 Drawing Sheets

SENSING LEAKAGE CURRENT IN FAULT MANAGED POWER SYSTEMS

FIELD

The present disclosure generally relates to fault managed power systems, and more particularly to systems and methods for measuring leakage current in an electronic circuit.

BACKGROUND

Fault managed power systems are configured to monitor and detect predefined faults, and mitigate detected faults in an electronic circuit, to maintain safe operating conditions of the electronic circuit. For example, fault managed power systems are configured to detect leakage current in electronic circuits as part of ensuring a touch-safe operation of the electronic circuit. Often times, fault managed power systems require complex circuitry to detect leakage current in electronic circuits, thereby complicating fault detection. Accordingly, the complex circuitry increases time and costs associated with the fault managed power systems.

Commonly assigned U.S. Patent Publication No. 2023/0221380, the entire disclosure of which is incorporated herein by reference, discloses fault managed power systems that may be used to detect fault conditions in electronic circuits.

SUMMARY

Aspects of the present disclosure permit an efficient framework for accurately measuring leakage current in an electronic circuit.

In one aspect, a fault managed power system is configured for measuring leakage current in an electronic circuit. The fault managed power system comprises a source controller electrically connected to the electronic circuit and configured to generate a pulsing input. The pulsing input comprises a series of pulses, each pulse comprising, at a predefined rate, a current-off time interval and current-on time interval. The source controller comprises a source driver and a source switch. The source driver is operably connected to the source switch. The source driver is configured to open and close the source switch in accordance with the pulsing input to control an electrical power supply from a power source to the electronic circuit during the current-on and current-off time intervals. A leakage current sensor is electrically connected to the electronic circuit. The leakage current sensor comprises a leakage current sensor driver and a leakage current sensor switch. The leakage current sensor switch is operably connected to the leakage current sensor. The leakage current sensor driver is operably connected to the source controller and the leakage current sensor switch. The leakage current sensor driver is configured to open and close the leakage current sensor switch based on the pulsing input received from the source controller. The leakage current sensor is configured to measure leakage current in the electronic circuit during the current-off time interval. A pulsing controller is electrically connected to the electronic circuit. The pulsing controller comprises a pulsing driver and a pulsing switch. The pulsing switch is operably connected to the leakage current sensor. The pulsing driver is operably connected to the source controller and the pulsing switch. The pulsing driver is configured to close and open the pulsing switch based on the pulsing input received from the source controller. The pulsing switch provides a return path for the leakage current during the current-off time interval. A load end circuit is electrically connected to the electronic circuit and to a load. The load end circuit comprises a blocking diode and a holdup capacitor electrically connected in series with the blocking diode. The holdup capacitor is configured to reverse bias the blocking diode during the current-off time interval to isolate the load from the electronic circuit, such that leakage current flows in the leakage current sensor to enable an accurate measurement of the leakage current in the electronic circuit.

In another aspect, a method for measuring leakage current in an electronic circuit comprises detecting a current-off time interval based on a pulsing input received from a source controller. A source switch of the source controller is opened to prevent power from being supplied from a power source to the electronic circuit during the current-off time interval. A pulsing switch electrically connected to the electronic circuit is closed, to provide a return path for leakage current during the current-off time interval. A blocking diode electronically connected to the electronic circuit and to a load with a holdup capacitor electrically connected in series with the blocking diode is reverse biased, to isolate the load from the electronic circuit. A leakage current sensor switch, electrically connected to the electronic circuit is opened, such that leakage current flows in a leakage current sensor electrically connected to the electronic circuit, to enable an accurate measurement of the leakage current in the electronic circuit. Leakage current in the electronic circuit is measured with the leakage current sensor during the current-off time interval.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Fault managed power systems (FMPS) provide systems and methods for safely transferring electric power. Suitably, FMPS are configured to monitor fault conditions of electronic circuits, and limit available power during a detected fault event to prevent hazards from occurring. FMPS are particularly beneficial in NEC® Class 4 systems, as FMPS can operate with a maximum line to line source voltage of up to 450 Vdc. Moreover, FMPS are governed with strict safety standards regarding human safety in the event of incidental human contact with power cables of electronic circuits.

One difficulty with current FMPS, is in detecting leakage current in electronic circuits. Particularly, a load connected to an electronic circuit, can interfere with leakage current measurement and detection. To counteract such interference, existing FMPS require complex circuitry at a load end of the electronic circuit, thus increasing costs and manufacturing and operation times associated with FMPS. On the contrary, aspects of the present disclosure provide improved FMPS and methods thereof for simply, accurately, and more efficiently monitoring leakage current within an electronic circuit, as will be explained in greater detail below.

Figure 1:
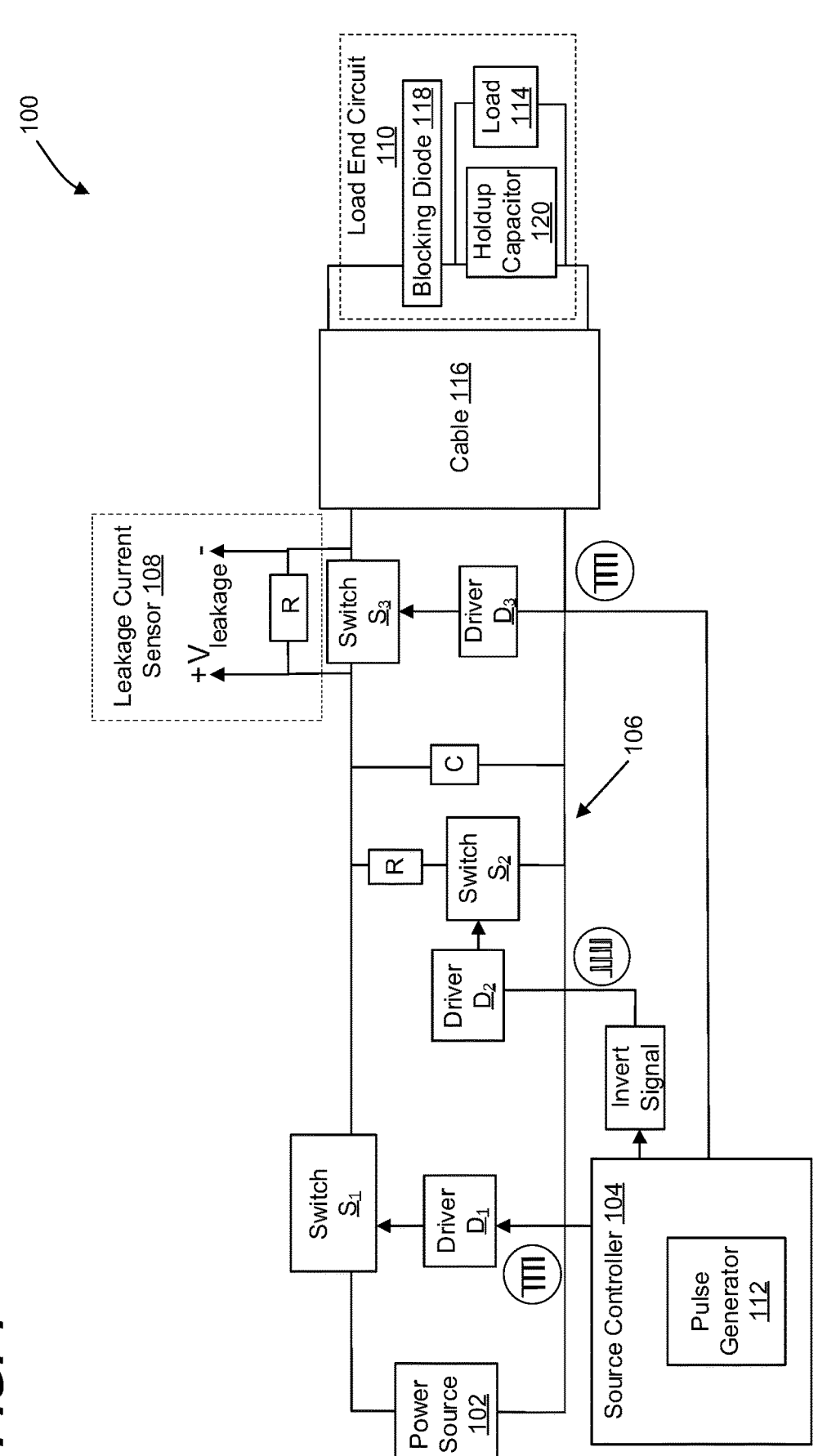
FIG. 1 is a schematic block diagram of a fault managed power system for an electronic circuit, according to an embodiment.

Referring now to FIG. 1, a fault managed power system (FMPS) in accordance with the present disclosure is generally indicated at reference number 100. The FMPS 100 is configured to measure and detect leakage current in an electronic circuit. Moreover, the FMPS 100 is configured to shut off power from a power source 102 electrically connected to the electronic circuit, in the event that leakage current exceeding a predetermined threshold is detected. Broadly the FMPS 100 comprises a source controller 104, a pulsing controller 106, a leakage current sensor 108, and a load-end circuit 110. A pulse generator 112 of the source controller 104 is configured to generate, at a predefined rate, a pulsing input comprising a series of pulses. These pulses define a current-off time interval and a current-on time interval. During the current-off time interval, the source controller 104 is configured to shut off power from the power source 102, to measure leakage current in the electronic circuit. Furthermore, the load end circuit 110 is configured to isolate a load 114, which is electrically connected to the electronic circuit, to prevent interference with leakage current measurement. The individual components of the FMPS 100 will now be described in greater detail before turning to an exemplary method of using the FMPS to measure leakage current.

In a non-limiting embodiment, the electronic circuit is electrically coupled to power source 102 and configured to supply power from the power source 102 along a cable 116 to the load 114. The power source 102, may comprise either an AC or DC power source, which typically comes from AC mains. In one example, the power source 102 comprises a possible voltage range of up to 1000 volts, but is typically between 100 V and 450 V (e.g., $V_1$=100 V to 450 V). Examples of cable 116 in accordance with the present disclosure include Class 4 cables and Powered Fiber Cables (PFC). In one embodiment, the cable 116 contains a pair of conductors, that are usually copper, and usually arranged as a twisted pair. For example, the cable 116 has similar characteristics as an AWG 12-2 cable. The load 114 may comprise an electrical device that is electrically coupled to the electronic circuit via the cable 116.

The source controller 104, is electrically coupled to the electronic circuit and configured to generate a pulsing input comprising a series of pulses at a predefined rate. For example, the source controller 104 comprises the pulse generator 112 such as an oscillator, for generating the pulsing input. The predefined rate at which the pulse generator 112 generates the pulsing input, allows the system to respond fast enough to prevent ventricular fibrillation (VF) and generally produces a very mild sensation before shutting off the voltage on the wires, a so-called touch-safe level. In other words, to maintain touch-safe operation, the amount of energy provided into a person must be kept below the let-go level. Toward that end, the FMPS 100 is equipped with the ability to detect when current levels exceed that considered to be touch-safe during a certain time interval, as will be explained in greater detail below.

Detecting non-touch safe current is accomplished by monitoring the pulsing input on the cable 116, at the source controller 104. Each pulsing input comprises, at the predefined rate, a current-on time interval and current-off time interval. The current-on time interval, corresponds to the period of time that current flows from the power source 102, through the electronic circuit and into the load 114, along cable 116. The current-off time interval, corresponds to the period of time when no current flows from the power source 102. During the current-off time interval, current on the cable 116 normally decays toward zero at a rate that depends on a system time constant. If human contact with the cable 116 is made, resulting in a leakage current fault condition, then current will flow due to the path provided by the person touching the conductor. This causes the current on the cable 116 to be non-zero after the transient has decayed, during the current-off time interval. If the current remains above a certain predetermined threshold, after the system transient time constant has elapsed, then this is an indication that a non-touch-safe current level is likely present. As will be described in greater detail below, upon detection of such non-touch-safe current level, the source controller 104 is configured to immediately turn off power from the power source 102 to limit energy provided into the person. More specifically, the energy provided into the person is limited to only the energy that is stored in the cable 116 which is designed to be at a level below electrical shock and fire hazard value.

The source controller 104 further comprises a source driver $D_1$ and a source switch $S_1$. The source driver $D_1$ is operably connected to the source switch $S_1$ and configured to open and close the source switch in accordance with the pulsing input, to connect or disconnect power from the power source 102. For example, during the current-on time interval, the source driver $D_1$ is configured to close the source switch $S_1$ to supply power from the power source 102, to the electronic circuit. During the current-off time interval, the source driver $D_1$ is configured to open the source switch $S_1$ such that no power is supplied from the power source 102, to the electronic circuit.

In one example, the source switch $S_1$ comprises a high power MOSFET switch. Preferably, the source switch $S_1$ comprises an N-channel enhancement mode SiC MOFSET switch, but other types of semiconductor switches may also be used. The particular type of semiconductor switch used determines in large part, the design of the source driver $D_1$. In general, switches having faster turn-on times are preferred in order to minimize switching losses. However, fast turn-on times may result in transient overvoltage, depending on cable 116 inductance and switch turn-off times, which may require transient overvoltage protection. Transient overvoltage protection can be implemented by placing a snubber, such as a diode, and a variable resistor, such as a metal oxide varistor (MOV), across the source switch $S_1$ to clamp the transient overvoltage at a predetermined level. It is also desirable to have switches with low on-state resistance to reduce conduction losses.

In one example, the source driver $D_1$ is a discrete gate driver. As alluded to above, the type of semiconductor switch used for the source switch $S_1$ determines in large part, the type of driver $D_1$. An example driver that may be used includes part number CGD15SG00D2 for third generation (CM3) SiC MOFSET available from Wolfspeed, Inc. It is possible, however for the source driver $D_1$ to be integrated with another component such as within the source controller 104.

The pulsing controller 106, is electrically connected to the electronic circuit and comprises a pulsing driver $D_2$ and a pulsing switch $S_2$. The pulsing driver $D_2$ is operably connected to the source controller 104 and the pulsing switch $S_2$. Moreover, the pulsing driver $D_2$ is configured to close and open the pulsing switch $S_2$ based on an inverted pulsing input received from the source controller 104. For example, the pulsing driver $D_2$ is configured to open the pulsing switch $S_2$ during the current-on time interval. Moreover, the pulsing driver $D_2$ is configured to close the pulsing switch $S_2$ during the current-off time interval such that the pulsing switch provides a return path to the return conductor for leakage current during the current-off time interval. In the illustrated embodiment, the pulsing controller 106 further comprises a resistor and a capacitor electrically connected to the electronic circuit for effective operation of the FMPS 100. As shown, the resistor of pulsing controller 106 is electrically connected in series with pulsing switch $S_2$ and the capacitor of pulsing controller 106 is electrically connected in parallel to the resistor and pulsing switch $S_2$.

In one example, the pulsing switch $S_2$ comprises a high power MOSFET switch. Preferably, the pulsing switch $S_2$ comprises an N-channel enhancement mode SiC MOFSET switch, but other types of semiconductor switches may also be used. The particular type of semiconductor switch used determines in large part, the design of the pulsing driver $D_2$. In general, switches having faster turn-on times are preferred in order to minimize switching losses. However, fast turn-on/turn-off times may result in transient overvoltage, depending on cable 116 inductance and switch turn-off times, which may require transient overvoltage protection. Transient overvoltage protection can be implemented by placing a snubber, such as a diode, and a variable resistor, such as a metal oxide varistor (MOV), across the pulsing switch $S_2$ to clamp the transient overvoltage at a predetermined level. It is also desirable to have switches with low on-state resistance to reduce conduction losses.

In one example, the pulsing driver $D_2$ is a discrete gate driver. As alluded to above, the type of semiconductor switch used for the pulsing switch $S_2$ determines in large part the type of driver $D_2$. An example driver that may be used includes part number CGD15SG00D2 for third generation (CM3) SiC MOFSET available from Wolfspeed, Inc. It is possible, however for the pulsing driver $D_2$ to be integrated with another component such as within the source controller 104.

The leakage current sensor 108 is electrically connected to the electronic circuit, and comprises a leakage current sensor driver $D_3$ and leakage current sensor switch $S_3$. The leakage current sensor switch $S_3$ is operably connected to the leakage current sensor 108. The leakage current sensor driver $D_3$ is operably connected to the source controller 104 and the leakage current sensor switch $S_3$. The leakage current sensor driver $D_3$ is configured to open and close the leakage current sensor switch $S_3$ based on the pulsing input received from the source controller 104. For example, the leakage current sensor driver $D_3$ is configured to close the leakage current sensor switch $S_3$ during the current-on time interval and open the leakage current sensor switch during the current-off time interval. Furthermore, the leakage current sensor 108 is configured to measure leakage current in the electronic circuit during the current-off time interval. For example, the leakage current sensor 108 is configured to detect leakage currents as part of ensuring touch-safe operation of the electronic circuit. The leakage current sensor 108 is configured to detect small currents on the order of 1 mA to 100 mA.

In one example, the leakage current sensor 108 comprises an operational amplifier, and a leakage sensing resistor connected across input terminals of the operational amplifier. The output of the leakage current sensor 108 is connected to the source controller 104, and in one example, specifically to an A/D converter thereof. The leakage current sensor switch $S_3$ is connected across the input terminals of the operational amplifier, for shunting current around the leakage current sensor 108 during the current-on time intervals, such that the leakage current sensor 108 only detects currents during the current-off time intervals. During the current-off time intervals, the source controller 104 controls the leakage current sensor driver $D_3$ to turn off (open) the leakage current sensor switch $S_3$ in synchronization with the turning off (opening) of the source switch $S_1$.

In one example, the leakage current sensor switch $S_3$ is an N-channel SiC MOSFET with a low drain-source resistance of about 5 m$\Omega$, for example, and rated for 100 V. Also, the design of the leakage current sensor 108 should account for common mode voltage ratings, since the leakage sensing resistor is on the high side of the power source 102. Thus, the operational amplifier should either be rated for the full voltage across an input capacitor, or be floated. The leakage sensing resistor effectively dissipates practically no power, since rated circuit current (e.g., about 2 to 16 A) is not flowing through the leakage sensing resistor during the current-off time intervals.

The load end circuit 110 is electrically connected to the electronic circuit and to the load 114. In the illustrated embodiment, the load end circuit 110 is electrically connected to the electronic circuit via cable 116. The load circuit 110 comprises a blocking diode 118, and a holdup capacitor 120 electrically connected in series with the blocking diode. The holdup capacitor 120 is configured to reverse bias the blocking diode 118 during the current-off time interval to isolate the load 114 from the electronic circuit, such that leakage current flows in the leakage current sensor 108 to enable an accurate measurement of the leakage current in the electronic circuit. Accordingly, the simplistic design of the load end circuit 110 provides a simple cost-effective solution for reducing circuit complexity in FMPS.

Figure 2:
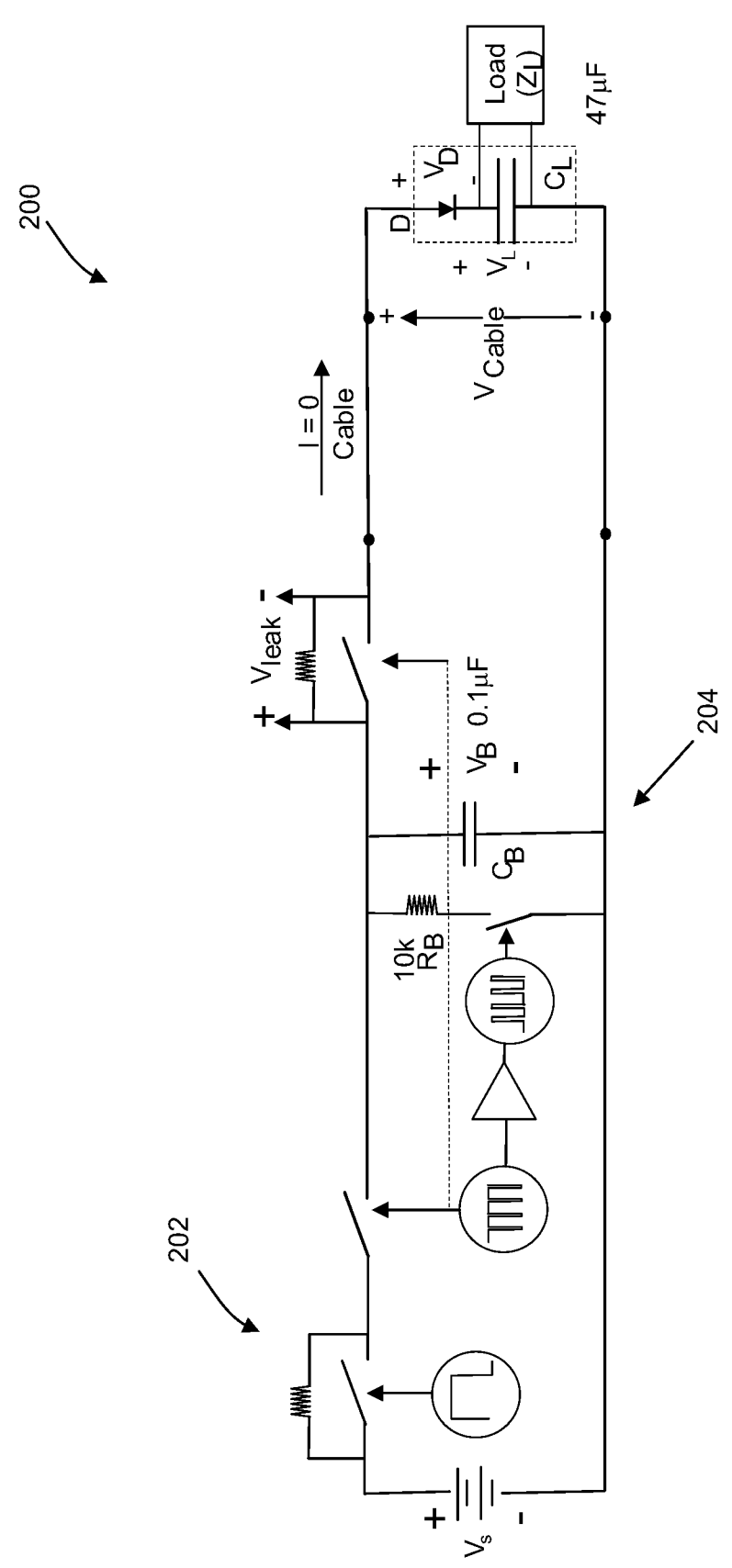
FIG. 2 illustrates another fault managed power system, according to an embodiment.

Referring now to FIG. 2 an exemplary embodiment of a fault managed power system 200, in accordance with the present disclosure is shown. Particularly the FMPS 200 is shown including at least one in the same and similar components as detailed above, and an inrush current limiter 202. As shown, the inrush current limiter 202 is electrically connected to the electronic circuit and the power source 102. The inrush current limiter 202 is configured to limit inrush current from the power source 102 during the current-on time interval. In FIG. 2, to reduce receiver circuit complexity, blocking diode D and holdup capacitor $C_L$ are used at the load in conjunction with a voltage balance circuit to ensure that no current flows, in the case of no fault on cable 116, during the current-off interval. The voltage balance circuit ensures diode D is reverse biased during off interval by draining voltage on capacitor $C_B$.

Figure 3:
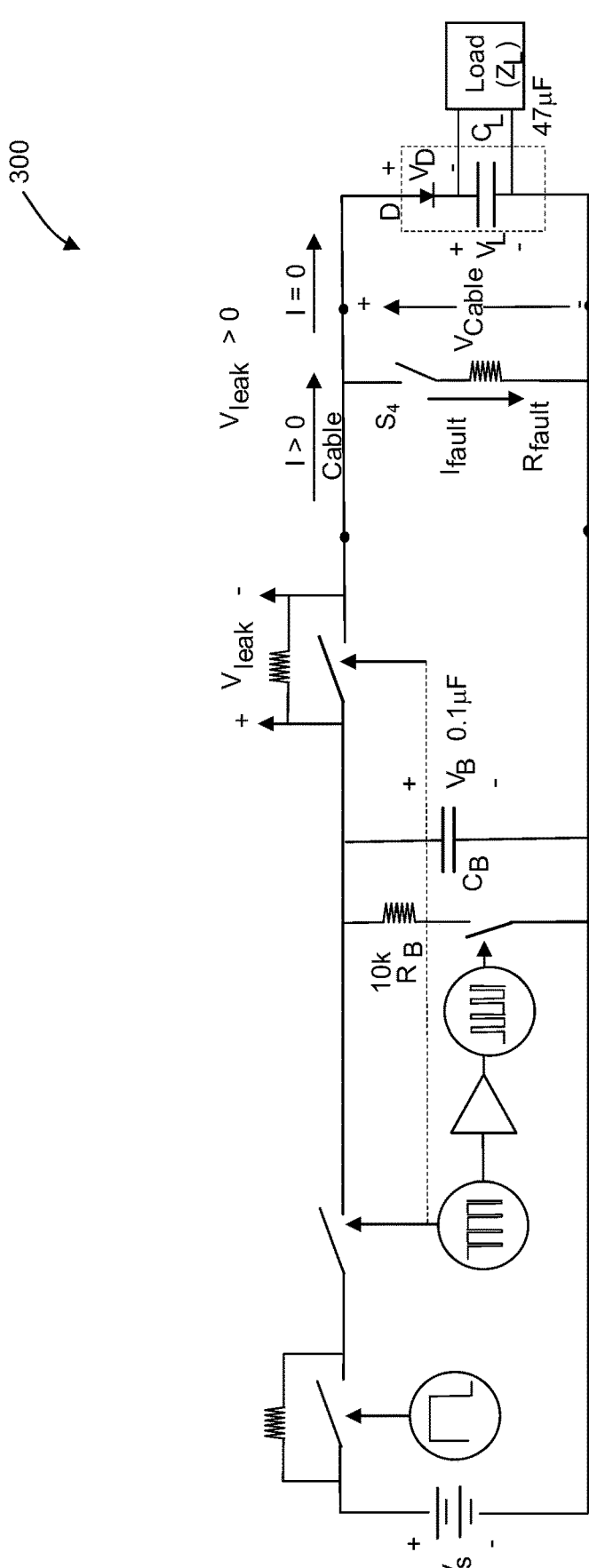
FIG. 3 illustrates another fault managed power system, according to an embodiment.

In the example of FIG. 2:

$V_B = V_{Cable} = V_o e^{-t/R_B C_B}$ during current-off time interval $V_L = V_o e^{-t/Z_L C_L}$ during current-off time interval $V_L > V_{cable} - V_D$ during current-off time interval IF $V_{Leak} \geq V_{threshold}$ turn off source switch Size $C_L$ according to load impedance Referring now to FIG. 3, an exemplary embodiment of a FMPS 300 is shown. Particularly the FMPS 300 is shown including at least one in the same and similar components as detailed above. However, FIG. 3 additionally provides a schematic representation of a fault condition for purposes of illustrating how the leakage current would change from a non-fault to a fault condition when human contact is made. Furthermore, closing switch $S_4$ represents a person touching across line-to-line, and the resistor represents the person's resistance as current flows through the body to ground rather than through the load 114.

In the example of FIG. 3:

$V_B = V_{Cable} + IR_{Cable} = V_o e^{-t/R_B C_B}$ during current-off time interval $V_L = V_L(0) e^{-t/Z_L C_L}$ during current-off time interval $V_L > V_{cable} - V_D$ during current-off time interval $Z_L C_L > R_B C_B$ approximately (ignoring IR cable drop and diode drop)

IF $V_{Leak} \geq V_{threshold}$ turn off source switch

The fault managed power system as described above is configured for measuring leakage current in an electronic circuit. An exemplary method of using the fault managed power system will now be described.

The method begins with operation of the pulse generator 112. The pulse generator 112, generates the pulsing input including the series of pulses, at a predefined rate such that each pulse comprises a current-on time interval and a current-off time interval. As explained above, the pulsing input is generated at a predefined rate that is below a rate that would result in the inability of a person to let-go of the energized cable and resulting electrical shock during the pulse. The source controller 104 is configured to provide the pulsing input to the source driver $D_1$, pulsing driver $D_2$, and leakage current sensor driver $D_3$ to determine action.

Figure 4:
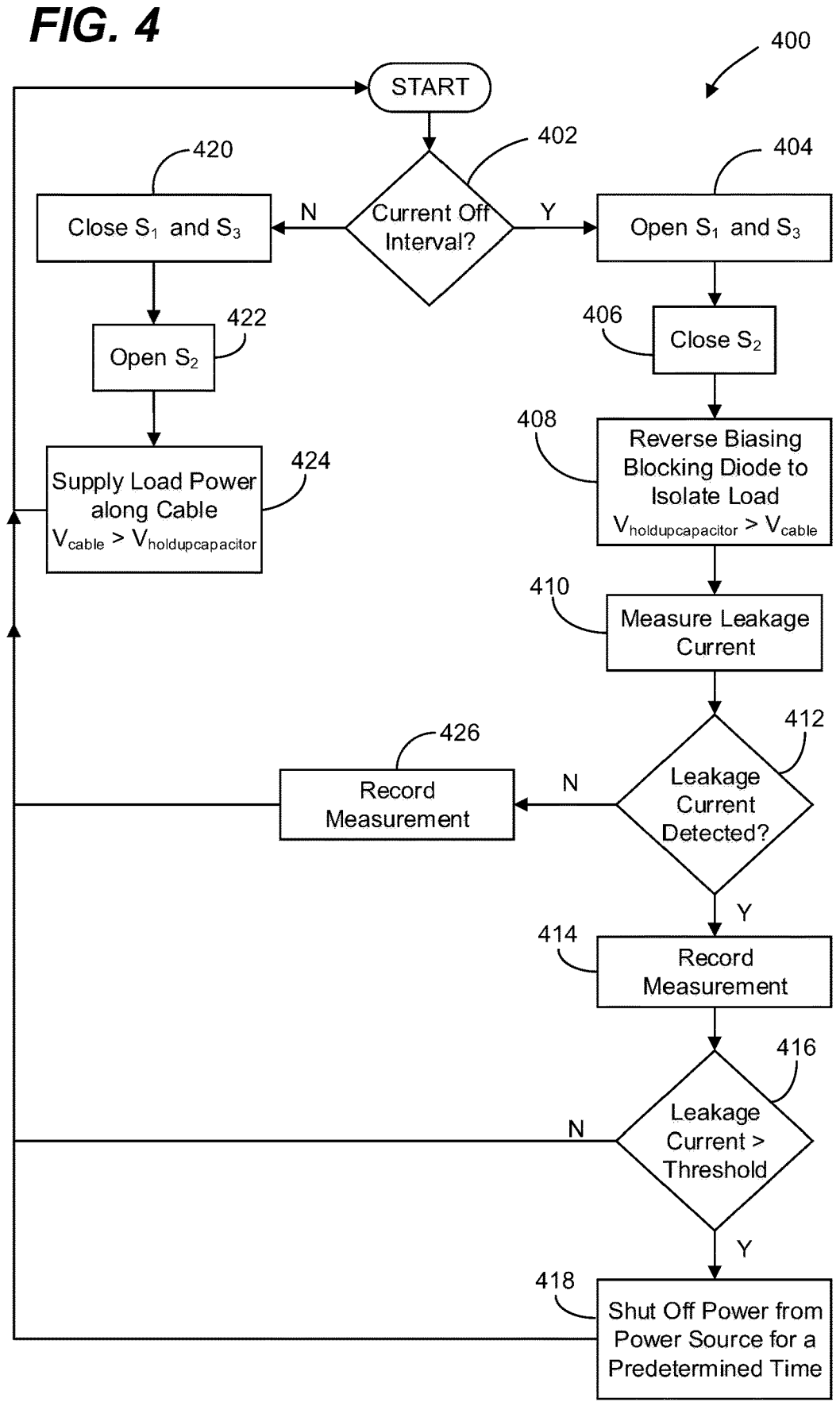
FIG. 4 is a flow diagram illustrating an exemplary method for measuring leakage current in an electronic circuit, according to an embodiment.

Referring now to FIG. 4, the FMPS 100 executes the method 400 based on the pulsing input. The FMPS at step 402 operates in either a current-off time interval or a current-on time interval as determined by source controller 104. During a current-off time interval, the method proceeds to step 404 wherein the source driver $D_1$ opens the source switch $S_1$ to prevent power from being supplied from the power source 102 to the electronic circuit during the current-off time interval. Moreover, the leakage current sensor driver $D_3$ opens the leakage current sensor switch $S_3$ to permit current to flow into the leakage current sensor 108. At step 406, the pulsing driver $D_2$, which is responsive to an inverted pulse signal, closes the pulsing switch $S_2$ to provide a path to the return conductor for leakage current during the current-off time interval. At step 408, the holdup capacitor 120 reverse biases the blocking diode 118 to isolate the load 114 from the electronic circuit, since the voltage across the holdup capacitor 120 is designed to be greater than the voltage ($V_B$) across the storage capacitor $C_B$. Next, at step 410, the leakage current sensor 108 measures leakage current, and provides the measurement as output to the source controller 104. The source controller 104, at step 412, then determines if any leakage current has been detected by the leakage current sensor 108. If no leakage current is detected, the method proceeds to step 426 wherein the null measurement is recorded in a system database. In one embodiment, the source controller 104 is configured to communicate with the system database to record the measurement. Otherwise, the method proceeds to step 414.

At step 414, the detected leakage current is recorded in the system database. Next at 416, the source controller 104 determines if the detected leakage current is greater than a predetermined threshold. In another embodiment, the source controller 104 additionally determines if the detected leakage current remains greater than the predetermined threshold for a predetermined amount of time. If in either case the determination is yes, the method proceeds to step 418. At step 418 the source controller 104 is configured to shut off power from the power source 102 for a predetermined amount of time to prevent fire and safety hazards.

Referring back to step 402, if the pulsing input indicates a current-on time interval, then at step 420, the source driver $D_1$ closes the source switch $S_1$ to supply electrical power from the power source 102 to the electronic circuit. Moreover, the leakage current sensor driver $D_3$ closes the leakage current sensor switch $S_3$, and at step 422 the pulsing driver $D_2$ opens the pulsing switch $S_2$. Thus, at step 424, power is supplied to the load 114 along the cable 116.

Embodiments of the present disclosure comprise a special purpose computer including a variety of computer hardware, as described in greater detail herein and are operational with other special purpose computing system environments or configurations even if described in connection with an example computing system environment. The computing system environment is not intended to suggest any limitation as to the scope of use or functionality of any aspect of the invention. Moreover, the computing system environment should not be interpreted as having any dependency or requirement relating to any one or combination of components illustrated in the example operating environment. Examples of computing systems, environments, and/or configurations that may be suitable for use with aspects of the present disclosure include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Aspects of the present disclosure may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the present disclosure may also be practiced in distributed computing environments where tasks are performed by remote processing devices that are linked through a communications network. In a distributed computing environment, program modules may be located in both local and remote storage media including memory storage devices. For purposes of illustration, programs and other executable program components may be shown as discrete blocks. It is recognized, however, that such programs and components reside at various times in different storage components of a computing device, and are executed by a data processor(s) of the device.

In operation, processors, computers, and/or servers may execute the processor-executable instructions (e.g., software, firmware, and/or hardware) such as those illustrated herein to implement aspects of the invention. The processor-executable instructions may be organized into one or more processor-executable components or modules on a tangible processor readable storage medium. Also, embodiments may be implemented with any number and organization of such components or modules. For example, aspects of the present disclosure are not limited to the specific processor-executable instructions or the specific components or modules illustrated in the figures and described herein. Other embodiments may include different processor-executable instructions or components having more or less functionality than illustrated and described herein.

The order of execution or performance of the operations in accordance with aspects of the present disclosure illustrated and described herein is not essential, unless otherwise specified. That is, the operations may be performed in any order, unless otherwise specified, and embodiments may include additional or fewer operations than those disclosed herein. For example, it is contemplated that executing or performing a particular operation before, contemporaneously with, or after another operation is within the scope of the present disclosure.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively, or in addition, a component may be implemented by several components.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products without departing from the scope of the invention, it is intended that all matter contained in the above description and shown in the accompanying drawings shall be interpreted as illustrative and not in a limiting sense.

The Abstract and Summary are provided to help the reader quickly ascertain the nature of the technical disclosure. They are submitted with the understanding that they will not be used to interpret or limit the scope or meaning of the claims. The Summary is provided to introduce a selection of concepts in simplified form that are further described in the Detailed Description. The Summary is not intended to identify key features or essential features of the claimed subject matter, nor is it intended to be used as an aid in determining the claimed subject matter.

The invention claimed is:

1. A fault managed power system configured for measuring leakage current in an electronic circuit, the fault managed power system comprising:

a source controller electrically connected to the electronic circuit and configured to generate a pulsing input, the pulsing input comprising a series of pulses, each pulse comprising, at a predefined rate, a current-off time interval and current-on time interval;

a source driver electrically connected to the source controller;

a source switch electrically connected to the source controller, the source driver being operably connected to the source switch and configured to open and close the source switch in accordance with the pulsing input to control an electrical power supply from a power source to the electronic circuit during the current-on and current-off time intervals;

a leakage current sensor electrically connected to the electronic circuit;

a leakage current sensor switch, the leakage current sensor switch being operably connected to the leakage current sensor;

a leakage current sensor driver, the leakage current sensor driver being operably connected to the source controller and the leakage current sensor switch, the leakage current sensor driver being configured to open and close the leakage current sensor switch based on the pulsing input received from the source controller, the leakage current sensor being configured to measure leakage current in the electronic circuit during the current-off time interval;

a pulsing controller electrically connected to the electronic circuit, the pulsing controller comprising a pulsing driver and a pulsing switch, the pulsing switch being operably connected to the leakage current sensor, the pulsing driver being operably connected to the source controller and the pulsing switch, the pulsing driver being configured to close and open the pulsing switch based on the pulsing input received from the source controller, the pulsing switch providing a return path for the leakage current during the current-off time interval; and a load end circuit electrically connected to the electronic circuit and to a load, the load end circuit comprising a blocking diode and a holdup capacitor electrically connected in series with the blocking diode, wherein the holdup capacitor is configured to reverse bias the blocking diode during the current-off time interval to isolate the load from the electronic circuit, such that leakage current flows in the leakage current sensor to enable an accurate measurement of the leakage current in the electronic circuit.

2. The fault managed power system of claim 1, wherein the source controller comprises a pulse generator configured to generate the pulsing input.

3. The fault managed power system of claim 2, wherein the pulse generator comprises an oscillator.

4. The fault managed power system of claim 1, wherein the predefined rate is below a rate that would result in the inability of a person letting-go and going into ventricular fibrillation from an electrical shock.

5. The fault managed power system of claim 1, wherein the source driver is a discrete gate driver, and wherein the source driver is configured to close the source switch during the current-on time interval to supply electrical power from the power source into the electronic circuit, and wherein the source driver is configured to open the source switch during the current-off time interval such that no electrical power is supplied from the power source into the electronic circuit.

6. The fault managed power system of claim 1, wherein the leakage current sensor driver is configured to close the leakage current switch during the current-on time interval and open the leakage current switch during the current-off time interval.

7. The fault managed power system of claim 1, wherein the leakage current sensor further comprises at least one of an operational amplifier and a leakage sensing resistor.

8. The fault managed power system of claim 1, wherein the pulsing driver is configured to open the pulsing switch during the current-on time interval and close the pulsing switch during the current-off time interval.

9. The fault managed power system of claim 1, wherein the pulsing controller further comprises at least one of a resistor and a capacitor.

10. The fault managed power system of claim 1, wherein said load end circuit is electrically connected to the electronic circuit via a cable, the source driver being configured to open and close the source switch in accordance with the pulsing input to supply electrical power from the power source to the electronic circuit and to the load along the cable, during the current-on time interval.

11. The fault managed power system of claim 1, further comprising an inrush current limiter electrically connected to the electronic circuit and to the power source, the inrush current limiter being configured to limit inrush current from the power source during the current-on time interval.

12. A method for measuring leakage current in an electronic circuit, the method comprising:

detecting a current-off time interval based on a pulsing input received from a source controller;

opening a source switch of the source controller to prevent power from being supplied from a power source to the electronic circuit during the current-off time interval;

closing a pulsing switch electrically connected to the electronic circuit, to provide a return path for leakage current during the current-off time interval;

reverse biasing a blocking diode electronically connected to the electronic circuit and to a load with a holdup capacitor electrically connected in series with the blocking diode, to isolate the load from the electronic circuit; and opening a leakage current sensor switch electrically connected to the electronic circuit, such that leakage current flows in a leakage current sensor electrically connected to the electronic circuit, to enable an accurate measurement of the leakage current in the electronic circuit;

measuring leakage current in the electronic circuit with the leakage current sensor during the current-off time interval.

13. The method of claim 12, further comprising generating the pulsing input at a predefined rate, the pulsing input comprising a series of pulses, each pulse comprising, at the predefined rate, the current-off time interval and current-on time interval.

14. The method of claim 12, wherein the predefined rate is below a rate that would result in a person being unable to let-go and going into ventricular fibrillation from an electrical shock.

15. The method of claim 12, further comprising recording the leakage current measurement for the electronic circuit in a system database.

16. The method of claim 12, further comprising comparing the leakage current measurement to a predetermined threshold to determine if the leakage current measurement meets or exceeds the predetermined threshold.

17. The method of claim 16, further comprising opening the source switch for a predetermined amount of time, to prevent power from being supplied from the power source to the electronic circuit, if the leakage current measurement meets or exceeds the predetermined threshold.

18. The method of claim 12, further comprising detecting a current-on time interval based on the pulsing input received from the source controller, and withholding from measuring leakage current in the electronic circuit.

19. The method of claim 18, wherein said withholding during the current-on time interval further comprises closing the source switch to supply electrical power from the power source to the electronic circuit, closing the leakage current sensor switch, and opening the pulsing switch.

20. The method of claim 19, further comprising supplying power from the electronic circuit along a cable electrically connected to the electronic circuit, to the load during the current-on time interval.

21. A non-transitory computer-readable medium having instructions stored thereon for causing a computing device to execute a method for measuring leakage current in an electronic circuit, the method comprising:

detecting a current-off time interval based on a pulsing input received from a source controller;

reverse biasing a blocking diode electronically connected to the electronic circuit and to a load with a holdup capacitor electrically connected in series with the blocking diode, to isolate the load from the electronic circuit;

opening a leakage current sensor switch electrically connected to the electronic circuit, such that leakage current flows in a leakage current sensor electrically connected to the electronic circuit, to enable an accurate measurement of the leakage current in the electronic circuit;

measuring leakage current in the electronic circuit with the leakage current sensor during the current-off time interval; and comparing the leakage current measurement to a predetermined threshold to determine if the leakage current measurement meets or exceeds the predetermined threshold; and opening a source switch for a predetermined amount of time, to prevent power from being supplied from a power source to the electronic circuit, if the leakage current measurement meets or exceeds the predetermined threshold.

* * * * *